United States Patent
Sato et al.

(10) Patent No.: US 7,580,308 B2
(45) Date of Patent: Aug. 25, 2009

(54) SEMICONDUCTOR MEMORY DEVICE AND REFRESH METHOD FOR THE SAME

(75) Inventors: Hajime Sato, Kasugai (JP); Yuji Nakagawa, Kasugai (JP); Satoru Kawamoto, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/812,420

(22) Filed: Jun. 19, 2007

(65) Prior Publication Data

US 2007/0247949 A1 Oct. 25, 2007

Related U.S. Application Data

(62) Division of application No. 11/070,888, filed on Mar. 3, 2005, now Pat. No. 7,248,525.

(51) Int. Cl.
G11C 7/00 (2006.01)
(52) U.S. Cl. .............. 365/222; 365/189.09; 365/230.06
(58) Field of Classification Search .............. 365/222, 365/189.09, 230.06
See application file for complete search history.

(56) References Cited

U.S. PATENT DOCUMENTS

| | | | |
|---|---|---|---|
| 4,758,993 A | 7/1988 | Takemae | |
| 4,933,907 A | 6/1990 | Kumanoya et al. | |
| 5,113,374 A | 5/1992 | Matsui | |
| 5,408,144 A | 4/1995 | Sakata et al. | |
| 5,521,527 A | 5/1996 | Sakata et al. | |
| 5,594,701 A | 1/1997 | Asaka et al. | |
| 5,596,542 A | 1/1997 | Sugibayashi et al. | |
| 5,602,784 A | 2/1997 | Kojima et al. | |
| 5,606,265 A | 2/1997 | Sakata et al. | |
| 5,689,469 A | 11/1997 | Asaka et al. | |
| 5,748,520 A | 5/1998 | Asaka et al. | |
| 5,751,653 A | 5/1998 | Chung et al. | |
| 5,808,955 A | 9/1998 | Hwang et al. | |
| 5,825,198 A | 10/1998 | Sakata et al. | |
| 5,970,018 A | 10/1999 | Iwata et al. | |
| 6,002,635 A | 12/1999 | Matano | |
| 6,031,781 A | 2/2000 | Tsuji et al. | |
| 6,055,206 A | 4/2000 | Tanizaki et al. | |
| 6,154,062 A | 11/2000 | Sakata et al. | |
| 6,185,137 B1 | 2/2001 | Sato et al. | |
| 6,268,741 B1 | 7/2001 | Sakata et al. | |
| 6,366,509 B2 | 4/2002 | Shirley | |

(Continued)

FOREIGN PATENT DOCUMENTS

JP  3-88195  4/1991

(Continued)

*Primary Examiner*—Hoai V Ho
*Assistant Examiner*—Kretelia Graham
(74) *Attorney, Agent, or Firm*—Arent Fox LLP

(57) ABSTRACT

A refresh method for a semiconductor memory device features high noise resistance, lower power consumption, and lower cost. All word lines of one or more memory cell blocks that have not been selected in a self refresh mode are controlled to have a floating potential substantially at ground level. Even when a word line and a bit line are short-circuited, this control prevents destruction of memory cell information, which may be caused by noise, and also prevents generation of leakage current. A fuse, etc., for preventing generation of leakage current is unnecessary, so that lower cost is realized.

6 Claims, 9 Drawing Sheets

U.S. PATENT DOCUMENTS

| | | |
|---|---|---|
| 6,384,623 B1 | 5/2002 | Sakata et al. |
| 6,459,301 B2 | 10/2002 | Hidaka |
| 2001/0052794 A1 | 12/2001 | Hidaka |
| 2002/0053924 A1 | 5/2002 | Sakata et al. |
| 2002/0135397 A1 | 9/2002 | Sakata et al. |

FOREIGN PATENT DOCUMENTS

| | | |
|---|---|---|
| JP | 4-006696 | 1/1992 |
| JP | 4-155692 | 5/1992 |
| JP | 6-203558 | 7/1994 |
| JP | 6-232348 | 8/1994 |
| JP | 7-334987 | 12/1995 |
| JP | 8-87884 | 4/1996 |
| JP | 8-102529 | 4/1996 |
| JP | 8-203268 | 8/1996 |
| JP | 9-35475 | 2/1997 |
| JP | 10-208473 | 11/1997 |
| JP | 10-64260 | 3/1998 |
| JP | 11-86543 | 3/1999 |
| JP | 11-328955 | 11/1999 |
| JP | 2000-113670 | 4/2000 |
| JP | 2000-187977 | 7/2000 |
| JP | 2000-268571 | 9/2000 |

SEMICONDUCTOR MEMORY DEVICE AND REFRESH METHOD FOR THE SAME

CROSS-REFERENCE TO RELATED APPLICATIONS

This application is a divisional of U.S. patent application Ser. No. 11/070,888, filed Mar. 3, 2005 now U.S. Pat. No. 7,248,525, which is based upon and claims the benefits of priority from the prior International Patent Application No. PCT/JP2003/002185, filed on Feb. 27, 2003, the entire contents of which are incorporated herein by reference.

BACKGROUND OF THE INVENTION

The present invention relates to a semiconductor memory device and a refresh method for the semiconductor memory device.

In recent years, demands for lower power consumption of semiconductor memory devices, such as DRAMs (dynamic random access memory), are increasing. In particular, a strong desire exists for reducing current consumption in self-refresh operation, which is a data storing operation automatically executed to ensure data is maintained in a memory cell during standby.

FIG. 8 is a schematic block diagram of a semiconductor memory device (DRAM) describing a conventional self-refresh operation.

The semiconductor memory device 81 includes a memory cell array 82, an address buffer 83, an internal address counter 84, a predecoder 85, a block selection circuit 86, block controllers 87a to 87d, word line selectors 88a to 88d, and word decoders 89a to 89d.

The memory cell array 82 is divided into a plurality of (e.g., four in the figure) cell blocks BLK0 to BLK3, each of which includes a plurality of memory cells as one unit. The block controllers 87a to 87d, the word line selectors 88a to 88d, and the word decoders 89a to 89d are arranged in correspondence with the cell blocks BLK0 to BLK3, respectively.

The internal address counter 84 provides an internal address signal IADD during refresh. During normal operation, the internal address counter 84 receives an externally provided address signal ADD via the address buffer 83, and provides an internal address signal IADD.

The block selection circuit 86 generates a selection signal ϕi (i=0 to 3, the same applies hereinafter) for selecting a cell block to be subjected to self-refresh, based on the address signal IADD.

The block controllers 87a to 87d generate control signals BLKENi and WLENi for selecting the word line selectors 88a to 88d and the word decoders 89a to 89d corresponding to the cell blocks BLK0 to BLK3, based on the selection signal ϕi.

The word line selectors 88a to 88d are activated based on the control signal BLKENi, and a predecode signal PREi output from the predecoder 85, and generate a drive signal WLDRVi for driving word lines of the corresponding cell blocks BLK0 to BLK3.

The word decoders 89a to 89d are activated based on the control signal WLENi, and the predecode signal PREi output from the predecoder 85, and drive word lines of the corresponding cell blocks BLK0 to BLK3, based on the drive signal WLDRVi provided from the word line selectors 88a to 88d.

Bit lines of the cell blocks BLK0 to BLK3 are driven by a bit line precharge circuit 91 and a sense amplifier 92 (refer to FIG. 9), based on the selection signal ϕi output from the block selection circuit 86.

With the structure described above, when, for example, the cell block BLK0 is selected, only the memory cells included in the cell block BLK0 are refreshed.

The current consumed in a refresh operation (refresh current) includes a DC (direct current) component that is consumed steadily, and an AC (alternating current) component that is consumed in the refresh operation for memory cells. The DC component includes a tailing current (also referred to as an off leak current) generated due to the subthreshold of a peripheral circuit, and current consumed due to a physical deficiency. The AC component includes a charging and discharging current used in the refresh operation for memory cells.

One important way to reduce refresh current is by reducing the DC component and the AC component.

As one conventional factor in increasing refresh current, a process deficiency may cause a word line and a bit line to be short-circuited. If this happens, a leakage current (a deficient current) steadily flows from the bit line to the word line via the deficient portion (short-circuited portion).

FIG. 9 is a circuit diagram describing such a deficient current.

As shown in FIG. 9, a word line WL and a bit line BL are short-circuited (as indicated by a dashed line in the figure). The sense amplifier 92 connected to the bit line BL is provided with a precharge signal PR from the bit line precharge circuit 91. The bit line BL is precharged to have a predetermined potential (e.g., ½ VDD) when the corresponding cell block is not selected. The power supply VDD is the operating power supply for each circuit. The word decoder 89a (89b to 89d) connects the word line WL to a low potential power supply VSS (e.g., ground) when the corresponding cell block is not selected. As indicated by the arrow in the figure, a steady leakage current flows from the bit line BL to the word line WL.

Such a deficient portion (the word line WL, the bit line BL, etc.) caused by a process deficiency may be replaced by a redundant circuit, which is arranged in advance. However, the replacement does not eliminate the physical electric deficiency characteristic of the deficient portion. Thus, current flowing through the deficient position becomes a steady consumption current, and increases the DC component described above. Such a deficient portion is randomly generated. Further, the number of such deficient portions tends to increase as the scale of integration of memory cells increases toward finer processes. As a result, power consumption during self-refresh increases by the amount of such a steady deficient current. This is a major obstacle to realizing low power consumption.

To reduce such deficient current, for example, Japanese Laid-Open Patent Publication No. 2000-268571 proposes a first method described below. According to the first method, when a word line and a bit line are short-circuited during self-refresh, a precharge level for the bit line is set at a level corresponding to a floating state (e.g., ground level). In this way, the first method reduces the deficient current.

However, the first method has a problem at the time of switching from self-refresh operation (standby state) to a read/write operation (normal state). At the time of such switching, a long time is required to recover the level of the bit line, which is substantially at ground level, to a normal level (sense level). Thus, the first method fails to realize high-speed recovery from the standby state to the normal state.

In the first method, to prevent deficient current from being generated, each bit line connected to a memory cell that is yet to be refreshed is first controlled to have a potential in a floating state. Then, when the memory cell is to be refreshed, each bit line is controlled back to have a predetermined potential (½VDD). A charging and discharging operation executed along with such control increases the AC component. Thus, the first method may rather increase power consumption.

Further, the first method requires a test unit, which includes a fuse and an insulation gate, to be arranged in advance for all bit lines, to enable a deficient portion to be specified. The first method also requires a control unit for controlling each bit line based on deficiency information obtained by the test unit. Thus, the first method has the problem of an extremely large chip area. The first method further requires a testing process for specifying a deficient portion using the test unit described above, and a deficiency information storing process for storing deficiency information obtained by the testing process (disconnecting a fuse, turning off an insulation gate, etc.). Thus, the first method also has the problem of a high testing cost. One prior art technique relating to another conventional structure having these problems is disclosed, for example, in U.S. Pat. No. 6,366,509.

Further, for example, Japanese Laid-Open Patent Publication No. 8-203268 proposes a second method described below. According to the second method, all bit lines are controlled to be in a floating state when the corresponding memory cells are not accessed (i.e., when the corresponding cell block is not selected) regardless of whether the bit lines have a deficiency. In this way, the second method reduces deficient current.

However, the second method is unrealistic. In particular, a DRAM executes such an operation that transmits, as memory cell information, an extremely small amount of charge, which is accumulated in a capacitor having an extremely small area, to a bit line, and differentially amplifies a subtle amplitude of the bit line. Thus, if all the bit lines are controlled to be in a floating state, the potential of all the bit lines may become unstable. Then, a coupling noise may be generated in a bit line (non-deficient bit line) adjacent to a bit line having a deficient portion, and may cause the non-deficient bit line to have an unintended noise potential. As a result, a memory cell connected to the adjacent bit line may be turned on, and the storage contents of the memory cell may be changed. In this way, the second method may cause information destruction.

Further, for example, Japanese Laid-Open Patent Publication No. 8-102529 proposes a third method described below. The third method relates to a double word-line structure in which each word line is composed of a main word line and a sub word line. The double word-line structure intends to realize higher speed and lower power consumption of a large-capacity DRAM. According to the third method, each main word line includes a fuse, and a fuse in a line having a deficient portion is disconnected, to control its sub word line to be in a floating state. In this way, the third method reduces deficient current.

However, with each main word line including a fuse, the third method also has, like the first method, the problems of a large chip area and high testing cost.

Further, when a word line having a deficient portion is controlled to be in a floating state, a word line (non-deficient word line) adjacent to the deficient word line may have a coupling noise. Like the second method, the third method may also cause destruction of memory cell information. Further, with the third method, the deficient word line is controlled to be in a floating state. Thus, a bit line connected to an effective memory cell may have a coupling noise. This may cause erroneous reading of the memory cell.

SUMMARY OF THE INVENTION

The present invention provides a semiconductor memory device that features high noise resistance and lower power consumption without increasing chip area, and provides a refresh method for the semiconductor memory device.

The first aspect of the present invention provides a refresh method for a semiconductor memory. The refresh method is for refreshing memory cells included in a cell block that is selected, among a plurality of cell blocks, in refresh mode. The cell blocks are formed by dividing a memory cell array. The method deactivates all word line drive circuits for driving word lines included in cell blocks that are not selected, among the plurality of cell blocks, in the refresh mode, so that the word lines are controlled to have a floating potential.

The second aspect of the present invention provides a refresh method for a semiconductor memory. The refresh method is for refreshing memory cells included in a cell block that is selected, among a plurality of cell blocks, in refresh mode. The cell blocks are formed by dividing a memory cell array. The method activates all word line drive circuits for driving word lines included in cell blocks that are not selected, among the plurality of cell blocks, in the refresh mode, and deactivates power supply control circuits associated with the memory cell blocks that have not been selected, for supplying the word line drive circuits with a power supply for driving the word lines, so that the word lines, which are associated with the memory cell blocks that have not been selected, are controlled to have a floating potential.

The third aspect of the present invention provides a refresh method for a semiconductor memory. The refresh method is for refreshing memory cells included in a cell block that is selected, among a plurality of cell blocks, in refresh mode. The cell blocks are formed by dividing a memory cell array. The method includes a first step of controlling all word lines included in cell blocks that are not selected, among the plurality of cell blocks, in the refresh mode, to have a floating potential, a second step of controlling, when the cell block including the word lines that have been controlled to have the floating potential is selected as a refresh target after the first step, the floating potential to be a potential corresponding to a deactivated state of the word lines, and a third step of controlling the potential of the word lines to be a potential corresponding to an activated state of the word lines after the second step.

The fourth aspect of the present invention provides a semiconductor memory device. The semiconductor memory device refreshes memory cells included in a cell block that is selected, among a plurality of cell blocks, in refresh mode. The cell blocks are formed by dividing a memory cell array. The device includes a word line control circuit for generating a control signal for controlling all word lines, which are included in cell blocks that are not selected in the refresh mode, to have a floating potential based on a refresh mode signal indicating whether the device is in the refresh mode and a selection signal for selecting a cell block to be refreshed in the refresh mode.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor memory device 11 according to a first embodiment of the present invention will be discussed with reference to FIGS. 1 to 4.

Figure 1:
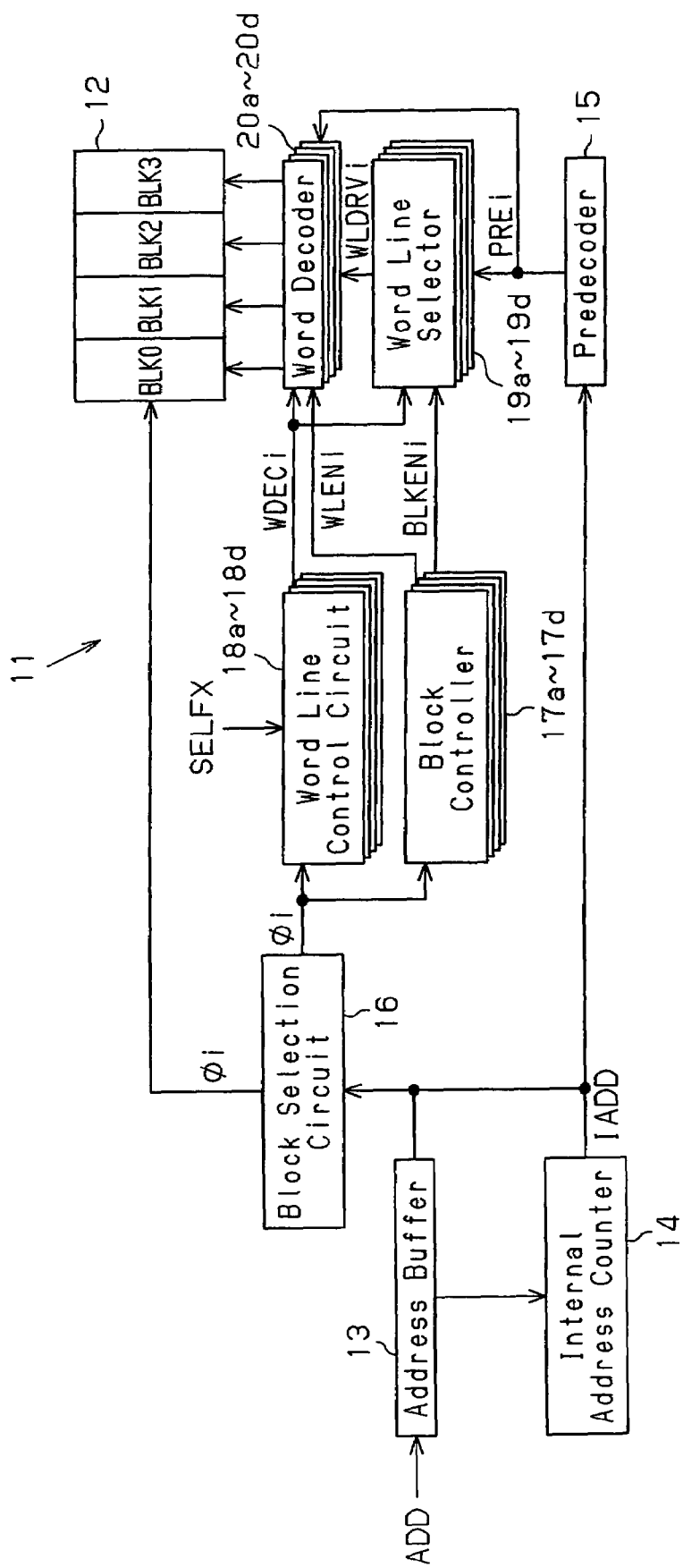
FIG. 1 is a schematic block diagram of a semiconductor memory device according to a first embodiment of the present invention.
Figure 8:
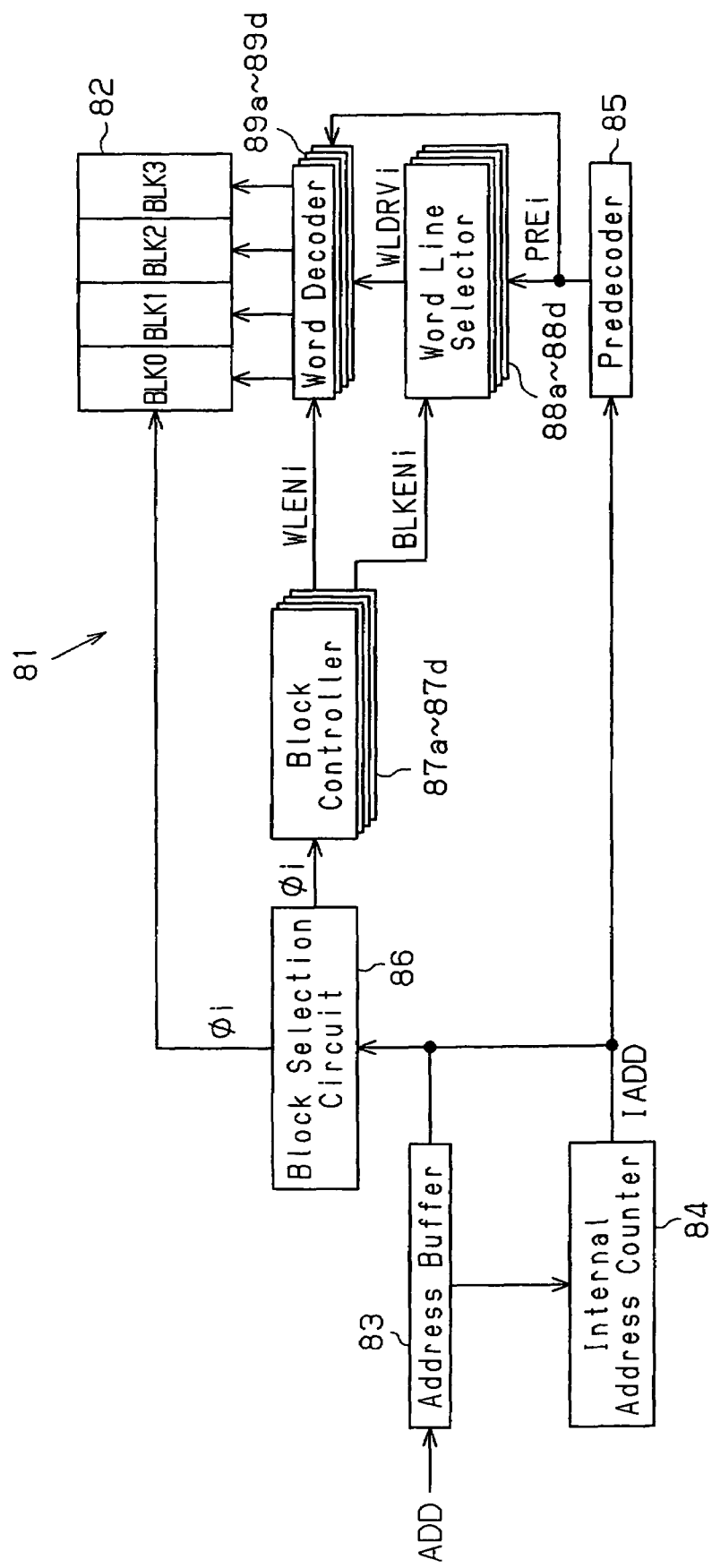
FIG. 8 is a schematic block diagram of a conventional semiconductor memory device.
Figure 9:
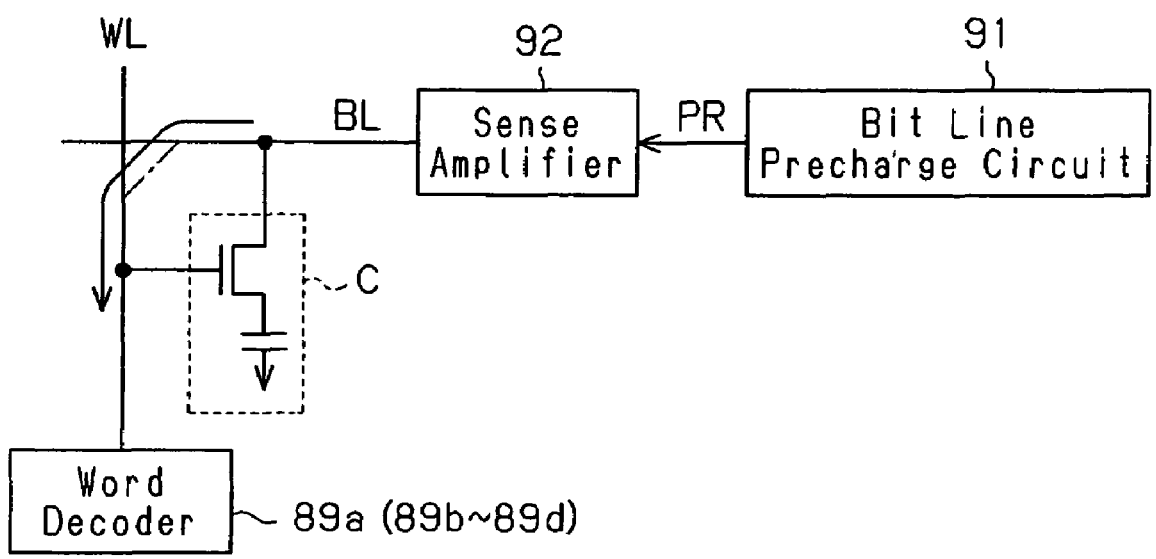
FIG. 9 is a circuit diagram describing a deficient current in the semiconductor memory device of FIG. 8.

FIG. 1 is a schematic block diagram of the semiconductor memory device 11 according to the first embodiment. The semiconductor memory device 11 includes a memory cell array 12, an address buffer 13, an internal address counter 14, a predecoder 15, a block selection circuit 16, block controllers 17a to 17d, word line control circuits 18a to 18d, word line selectors 19a to 19d, and word decoders 20a to 20d. The elements, which are the same as the elements of the conventional semiconductor memory device 81 shown in FIG. 8, are given the same label or reference numeral as those elements, and their detailed description is thus omitted.

The memory cell array 12 is divided into a plurality of (e.g., four in the figure) cell blocks BLK0 to BLK3, each of which includes a plurality of memory cells as one unit. The block controllers 17a to 17d, the word line control circuits 18a to 18d, the word line selectors 19a to 19d, and the word decoders 20a to 20d are arranged in correspondence with the cell blocks BLK0 to BLK3, respectively.

The word line control circuits 18a to 18d each generate a control signal WDECi for controlling the potential of word lines in the corresponding one of cell blocks BLK0 to BLK3, based on a refresh mode signal SELFX, and a selection signal φi (i=0 to 3, the same applies hereinafter) from the block selection circuit 16.

The refresh mode signal SELFX indicates whether the device is in the self-refresh mode. The refresh mode signal SELFX is set, for example, at a low (L) level during self-refresh. The selection signal φi is set, for example, at a high (H) level when the corresponding one of the cell blocks BLK0 to BLK3 is selected.

Figure 2:
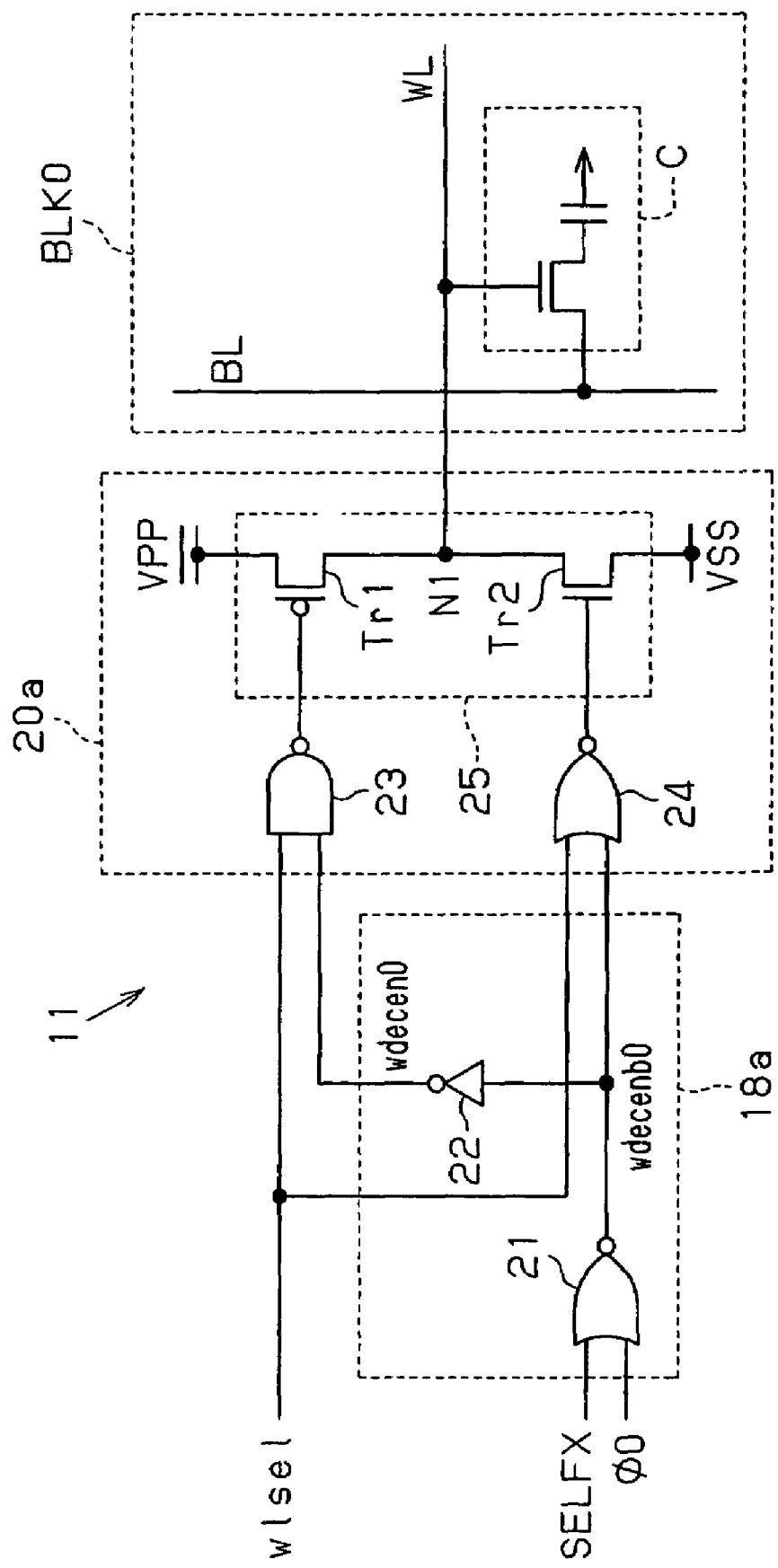
FIG. 2 is a schematic circuit diagram showing a part of the semiconductor memory device of FIG. 1.

FIG. 2 is a schematic circuit diagram of the semiconductor memory device 11. One memory cell C included in the cell block BLK0 is focused, and the operations of the word line control circuit 18a and the word decoder 20a, which are arranged in correspondence with the cell block BLK0, are described. The operations of the word line control circuits 18b to 18d, and the word decoders 20b to 20d, which are arranged in correspondence with the cell blocks BLK1 to BLK3, are the same as the operations described here.

The word line control circuit 18a includes a NOR circuit 21 and an inverter circuit 22. The word line control circuit 18a generates control signals wdecenb0 and wdecen0, based on the refresh mode signal SELFX and the selection signal φ0. Specifically, the NOR circuit 21 outputs the control signal wdecenb0 based on the refresh mode signal SELFX and the selection signal φ0. The inverter circuit 22 inverts the control signal wdecenb0 from the NOR circuit 21 and outputs the control signal wdecen0.

The word decoder 20a includes a NAND circuit 23, a NOR circuit 24, and a word line drive circuit 25. The word line drive circuit 25 is composed of a transistor Tr1 (first drive transistor) and a transistor Tr2 (second drive transistor). The transistor Tr1 is formed by a p-channel MOS (metal oxide semiconductor) transistor. The transistor Tr2 is formed by an n-channel MOS transistor.

The transistor Tr1 and the transistor Tr2 are connected in series. A word line WL is connected to the connecting node N1 of the transistor Tr1 and the transistor Tr2. The source of the transistor Tr1 is supplied with a drive power supply VPP as a first power supply, from the word line selector 19a (refer to FIG. 1). The source of the transistor Tr2 is supplied with a low potential power supply VSS (a ground power supply in this case) as a second power supply.

In the first embodiment, a tailing current A1 of the transistor Tr1 and a tailing current A2 of the transistor Tr2 are set to satisfy the relationship expressed as tailing current A1 < tailing current A2      (expression 1).

Each of the tailing currents A1 and A2 is an extremely small amount of current flowing between the source and the drain of each of the transistors Tr1 and Tr2 when the transistors Tr1 and Tr2 are in an off state. The tailing currents A1 and A2 are also referred to as subthreshold currents. The tailing currents A1 and A2 are set to satisfy the above expression 1 by, for example, forming the transistor Tr1 to have a smaller size than the transistor Tr2.

The NAND circuit 23 controls on and off of the transistor Tr1, based on a word line selection signal wlsel, which is generated by decoding an address signal IADD, and a control signal wdecen, which is output from the inverter circuit 22. The NOR circuit 24 controls on and off of the transistor Tr2 based on the word line selection signal wlsel, and the control signal wdecenb output from the NOR circuit 21.

When the refresh mode signal SELFX is at a H level indicating that the device is in the non self-refresh mode (i.e., during normal operation), the control signal wdecenb is set at a L level, and the control signal wdecen is set at a H level. The word line drive circuit 25 is activated based on the word line selection signal wlsel. In other word, during normal operation, the word line WL is activated based on the word line selection signal wlsel without depending on the selection signal φ0.

Specifically, one of the transistors Tr1 and Tr2 is turned on, and the other one of the transistors Tr1 and Tr2 is turned off. When the transistor Tr1 is turned on, the drive power supply VPP is supplied to the word line WL via the transistor Tr1 that is on, so that the word line WL is activated. This causes the memory cell C to be turned on, so that reading and writing of the memory cell 10 is performed via the bit line BL.

When the transistor Tr2 is turned on, the low potential power supply VSS at ground level is supplied to the word line WL via the transistor Tr2 that is on. In this case, the memory cell C is not turned on, and information in the memory cell C is retained.

When the refresh mode signal SELFX is at a L level indicating that the device is in the self-refresh mode, and when the cell block BLK0 is selected as a refresh target (the selection signal φ0 is at a H level) in the self-refresh mode, the control signal wdecenb is set at a L level and the control signal wdecen is set at a H level in the same manner as during normal operation described above. In the same manner, the word line drive circuit 25 is activated based on the word line selection signal wlsel.

Then, based on the word line selection signal wlsel, the transistor Tr1 included in the word line drive circuit 25 is turned on, so that the drive power supply VPP is supplied to the word line WL from the word line selector 19a. This causes the word line WL to be activated, and the memory cell C to be refreshed.

When the cell block BLK0 is not selected as a refresh target block (the selection signal φ0 is at a L level) in the self-refresh mode, the control signal wdecenb is set at a H level and the control signal wdecen is set at a L level. Thus, the transistors Tr1 and Tr2 included in the word line drive circuit 25 are both turned off.

In this case, the word line drive circuit 25 is controlled to be in a deactivated state, so that the word line WL included in the cell block BLK0 is controlled to be substantially in a state not connected to the word decoder 20a (i.e., in a floating state).

The following describes the potential of the word line WL in a floating state in detail.

In the first embodiment, the tailing currents A1 and A2 of the transistors Tr1 and Tr2 in a deactivated state are set to satisfy the above expression 1. Thus, the potential at the connecting node N1 is discharged to the low potential power supply VSS, and the word line WL is controlled to have a floating potential, which depends on the current ratio of the tailing currents A1 and A2 that satisfy the relationship of the above expression 1. In the first embodiment, the tailing current ratio is set so that the word line WL is controlled to have a floating potential substantially at ground level.

Thus, when the cell block BLK0 that is not selected includes a deficient word line WL forming a short circuit with a bit line BL, a consumption current flows via the deficient word line WL that is controlled to be in a floating state. However, the tailing currents limit the current flowing via the deficient word line WL. This enables the DC current to be reduced. In this way, a deficient current in the deficient word line WL in an unselected state is reduced.

The floating potential at the deficient portion of the deficient word line WL is raised by a short resistance etc. a little from the potential at the connecting node N1, which is determined by the above tailing currents A1 and A2 (hereafter the potential of the deficient word line WL at that time is referred to as a "deficient potential"). However, the memory cell C connected to the deficient word line WL is replaced by a redundant memory cell, which is not shown. Thus, no problem arises even if noise, etc., causes the memory cell C connected to the deficient word line WL to be turned on.

In the first embodiment, all word lines WL included in the cell block BLK0 that is in an unselected state are controlled to have a floating potential, regardless of whether the word lines WL have a deficiency. A word line WL having no deficiency is also set at a floating potential substantially at ground level. Thus, information destruction of the memory cell C, which may be caused when the memory cell C included in the cell block BLK0 in an unselected state is turned on, does not occur. Also, information destruction of the memory cell C, which may be caused by a coupling noise generated from an adjacent deficient word line WL, does not occur.

Further, with the word lines WL being controlled to have a floating potential substantially at ground level as described above, the potential of each word line WL is promptly reset to the low potential power supply VSS (ground level) at the time of switching of the cell block BLK0 from the unselected state to the selected state, or at the time of recovery from the standby state to the normal state.

At that time, when the cell block BLK0 includes a deficient word line WL, the potential of the deficient word line WL is set at the deficient potential. The reset time is a little longer for the deficient word line WL than for a non-deficient word line WL. However, one cell normally includes only a small number of deficient word lines WL (e.g., one or two deficient word lines WL among 1024 word lines WL). Thus, such deficient word lines WL have only little influence on the total reset time. The switching from the unselected state to the selected state, or the recovery from the standby state to the normal state is executed at high speed. Further, influence of noise, etc., is reduced, to enable stable recovery.

Next, the following describes the potential of the word line WL when the cell block BLK0 is selected in the self-refresh mode.

As described above, when the cell block BLK0 is in a selected state, the word line drive circuit 25 is activated based on the word line selection signal wlsel. All the word lines WL included in the cell block BLK0 are controlled to have the drive power supply VPP when activated, and to have the low potential power supply VSS when deactivated, in the same manner as during normal operation. In other words, when the cell block BLK0 is selected, the word lines WL are not controlled to be in a floating state, regardless of whether the word lines WL have a deficiency.

Thus, in the first embodiment, when the cell block BLK0 is selected, the potential of the deficient word line WL is controlled to have the low potential power supply VSS at ground level if the deficient word line WL is in a deactivated state. This improves noise resistance of a non-deficient word line WL adjacent to the deficient word line WL.

Coupling noise is prevented from being generated in the non-deficient word line WL adjacent to the deficient word line WL. Thus, information destruction, which may be caused by turning on of the memory cell C that is yet to be refreshed, does not occur. Also, a coupling noise, which may be generated by the deficient potential, is prevented from being generated in the bit line BL, and erroneous reading is prevented.

Figure 3:
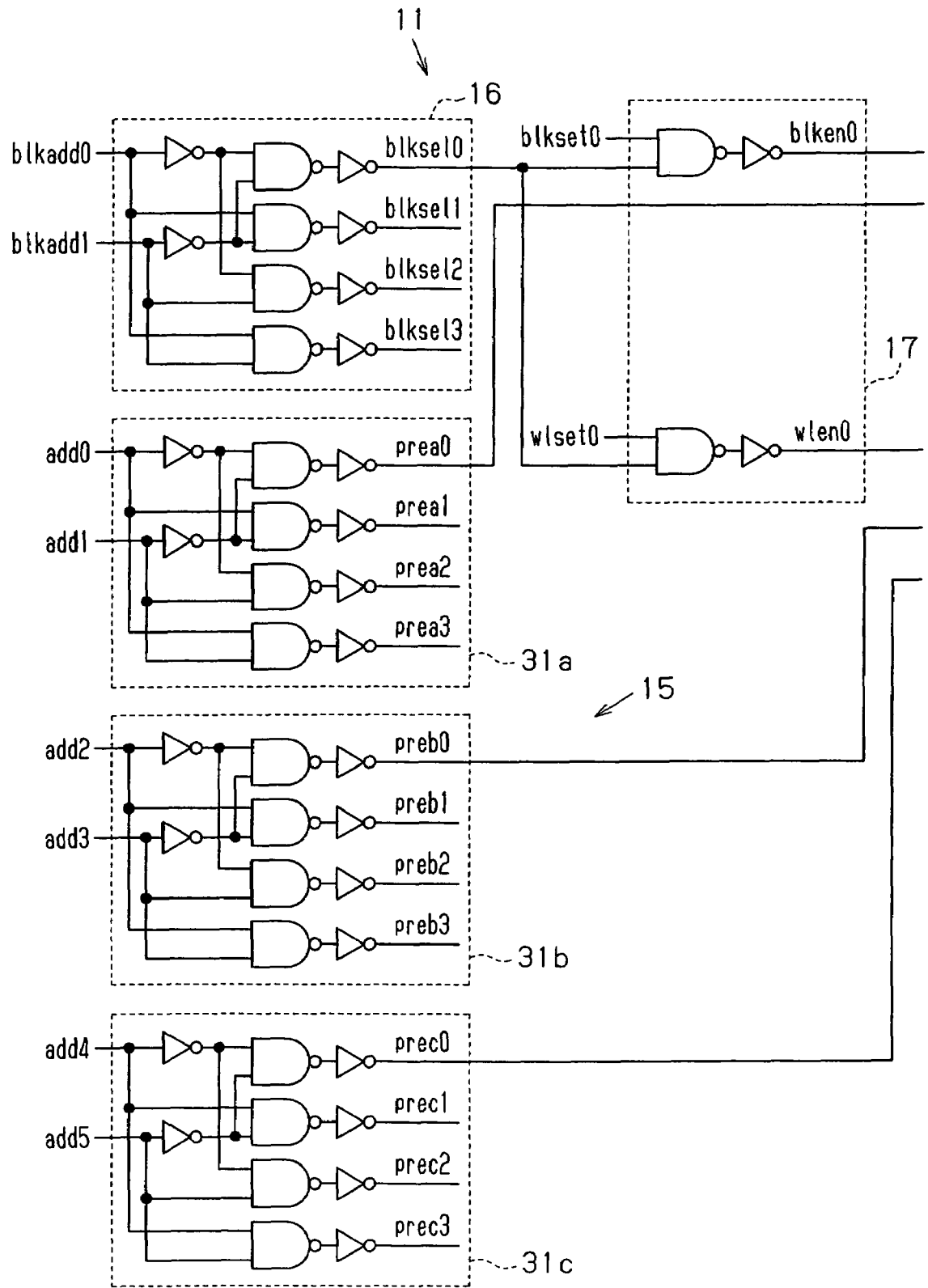
FIG. 3 is a circuit diagram of a block selection circuit, a predecoder, and a block controller included in the semiconductor device of FIG. 1.
Figure 4:
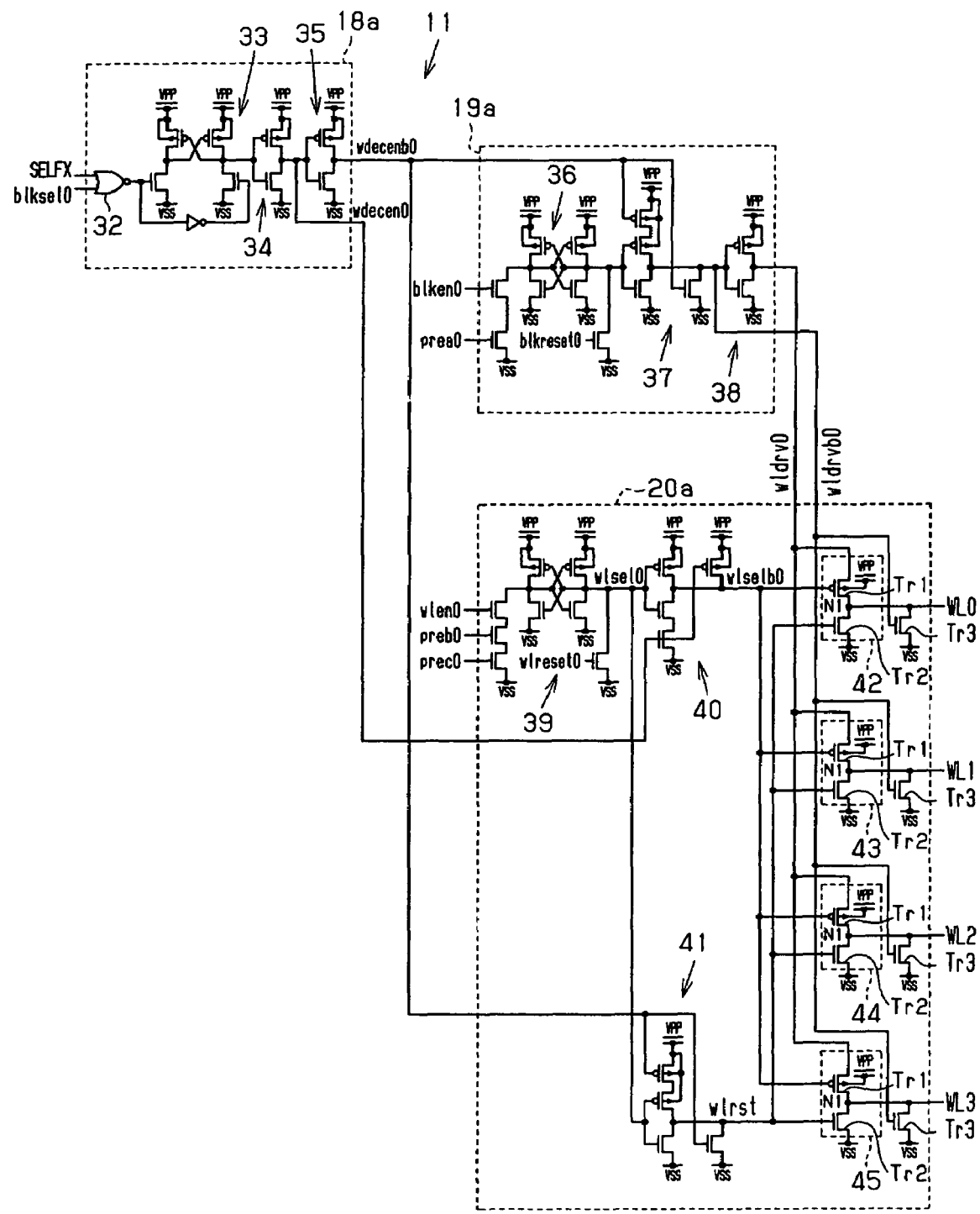
FIG. 4 is a circuit diagram of a word line control circuit, a word line selector, and a word decoder included in the semiconductor device of FIG. 1.

FIGS. 3 and 4 are circuit diagrams showing specific examples of the semiconductor memory device 11 shown in FIG. 1. Each figure shows the part relating to control of the cell block BLK0.

FIG. 3 is a circuit diagram showing specific examples of the predecoder 15, the block selection circuit 16, and the block controller 17a. Although not shown, the structures of the block controllers 17b to 17d are the same as the structure shown in the figure.

The predecoder 15 includes, for example, three predecoders 31a to 31c, and generates predecode signals pra0 to pra3, prb0 to prb3, and prc0 to prc3 based on address signals add0 to add5 for word line selection, which are output from the internal address counter 14 (refer to FIG. 1).

The block selection circuit 16 generates selection signals blksel0 to blksel3, based on address signals blkadd0 and blkadd1 for cell block selection, which are output from the internal address counter 14.

The selection signal blksel0 output from the block selection circuit 16, and control signals blkset0 and wlset0 from a memory controller, which is not shown, are input into the block controller 17a.

The block controller 17a generates a H level control signal blken0 for selecting the word line selector 19a (refer to FIG. 4), based on a H level selection signal blksel0 (when the cell block BLK0 is selected) and a H level control signal blkset0. Also, the block controller 17a generates a H level control signal wlen0 for selecting the word decoder 20a (refer to FIG. 4), based on a H level selection signal blksel0 and a H level control signal wlset0.

FIG. 4 is a circuit diagram showing specific examples of the word line control circuit 18a, the word line selector 19a, and the word decoder 20a. Although not shown, the word line control circuits 18b to 18d, the word line selectors 19b to 19d, and the word decoders 20b to 20d have the same structures as the structures shown in the figure.

The word line control circuit 18a is more specifically shown in FIG. 4. In the figure, the word line control circuit 18a includes a NOR circuit 32, a differential amplification circuit 33, and two inverters 34 and 35.

The word line control circuit 18a generates control signals wdecenb0 and wdecen0, based on the refresh mode signal SELFX input into the NOR circuit 32, and the selection signal blksel0. Specifically, when the refresh mode signal SELFX is at a L level indicating that the device is in the self-refresh mode, and the selection signal blksel0 is at a L level indicating that the cell block BLK0 is not selected, the word line control circuit 18a generates a H level control signal wdecenb0 and a L level control signal wdecen0. In other cases, the word line control circuit 18a generates a L level control signal wdecenb0 and a H level control signal wdecen0.

The word line selector 19a includes a latch circuit 36, a NOR circuit 37, and an inverter circuit 38. The latch circuit 36 is set at a H level based on a H level control signal blken0 output from the block controller 17a and a H level predecode signal pra0 output from the predecoder 31a, and is set at a L level based on a reset signal blkreset0 from the memory controller, which is not shown.

Then, the word line selector 19a generates drive signals wldrv0 and wldrvb0 based on the control signal wdecenb0 output from the word line control circuit 18a and a latch signal from the latch circuit 36.

In the self-refresh mode where the cell block BLK0 is not selected, the word line selector 19a outputs a H level drive signal wldrv0 (drive power supply VPP) and a L level drive signal wldrvb0 (low potential power supply VSS).

In the self-refresh mode or in the normal operation mode where the word line WL is activated, the word line selector 19a outputs a H level drive signal wldrv0 (drive power supply VPP) and a L level drive signal wldrvb0 (low potential power supply VSS).

In the self-refresh mode or in the normal operation mode where the word line WL is deactivated, the word line selector 19a outputs a L level drive signal wldrv0 (low potential power supply VSS) and a H level drive signal wldrvb0 (drive power supply VPP).

The word decoder 20a is more specifically shown in FIG. 4. The word decoder 20a has the structure corresponding to the case in which the cell block BLK0 includes, for example, four word lines WL0 to WL3.

The word decoder 20a includes a latch circuit 39, a NAND circuit 40, a NOR circuit 41, and four word line drive circuits 42 to 45.

Each of the word line drive circuits 42 to 45 is composed of the transistors Tr1 and Tr2 shown in FIG. 2 described above.

At the connecting node N1 of the transistors Tr1 and Tr2, a transistor Tr3 formed by an n-channel MOS transistor is connected in parallel to the transistor Tr2. The drive signal wldrvb0 from the word line selector 19a is applied to the gate of the transistor Tr3.

The latch circuit 39 outputs a H level word line selection signal wlsel, in response to a H level control signal wlen0 output from the block controller 17a and H level predecode signals prb0 and prc0 output from the predecoders 31b and 31c. The latch circuit 39 outputs a L level word line selection signal wlsel, in response to a reset signal wlreset0 from the memory controller, which is not shown.

The NAND circuit 40 and the NOR circuit 41 deactivate each of the word line drive circuits 42 to 45 when the control signal wdecenb0 is set at a H level and the control signal wdecen0 is set at a L level (in the self-refresh mode where the cell block BLK0 is not selected) in the same manner as the NAND circuit 23 and the NOR circuit 24 shown in FIG. 2 described above. The transistors Tr1 and Tr2 are turned off (the transistor Tr3 is turned off based on the drive signal wldrvb0), so that each of the word lines WL0 to WL3 is controlled to be in a floating state.

The NAND circuit 40 and the NOR circuit 41 activate each of the word line drive circuits 42 to 45 based on the word line selection signal wlsel when the control signal wdecenb0 is set at a L level and the control signal wdecen0 is set at a H level (in the self-refresh mode where the cell block BLK0 is selected, or in the normal operation mode).

The following describes the characteristics of the semiconductor memory device 11 according to the first embodiment of the present invention.

(1) In the self-refresh mode, all word lines WL included in cell blocks that are not selected, among the cell blocks BLK0 to BLK3, are controlled to have a floating potential substantially at ground level. Thus, when one or more cell blocks BLK0 to BLK3 are not selected, a deficient current is reduced to realize lower power consumption.

(2) At the time of switching of the cell blocks BLK0 to BLk3 from the unselected state to the selected state, or at the time of recovery from the standby state (self-refresh mode) to the normal state, the word lines WL, which have been controlled to have a floating potential substantially at ground level, are reset to have the low potential power supply VSS. This structure prevents an increase in the AC current along with the switching or the recovery.

(3) When one or more cell blocks BLK0 to BLK3 are not selected, the word lines WL are controlled to have a floating potential substantially at ground level. Thus, the switching from the unselected state to the selected state, or the recovery from the standby state (self-refresh mode) to the normal state is executed at high speed.

(4) When one of the cell blocks BLK0 to BLK3 is selected in the self-refresh mode, the word lines WL are controlled to have the drive power supply VPP or the low potential power supply VSS (i.e., the word lines WL are not controlled to be in a floating state). Thus, when the word lines WL are deactivated while one of the cell blocks BLK0 to BLK3 is selected, information destruction of the memory cell C, which may be caused by coupling noise generated from a deficient word line, does not occur. This realizes the semiconductor memory device 11 with high noise resistance.

(5) When one or more cell blocks BLK0 to BLK3 are in an unselected state, all the word lines WL are controlled to have a floating potential regardless of whether the word lines WL have a deficiency. Thus, each word line WL does not need to have a test unit including a fuse, an isolation gate, etc., to enable a deficient portion to be specified. Naturally, a control unit and etc. for controlling each word line WL based on deficiency information obtained by the test unit is unnecessary. Thus, an increase in the chip size is prevented.

(6) The testing process for specifying a deficient portion of a word line WL, and the deficiency information storing process for storing deficiency information obtained by the testing process (disconnecting a fuse, turning off an isolation gate etc.,) are also unnecessary. Thus, the testing cost relating to these processes is reduced.

A semiconductor memory device 51 according to a second embodiment of the present invention is discussed with reference to FIG. 5. The second embodiment differs from the first embodiment in the method for setting a floating potential of a word line WL.

Figure 5:
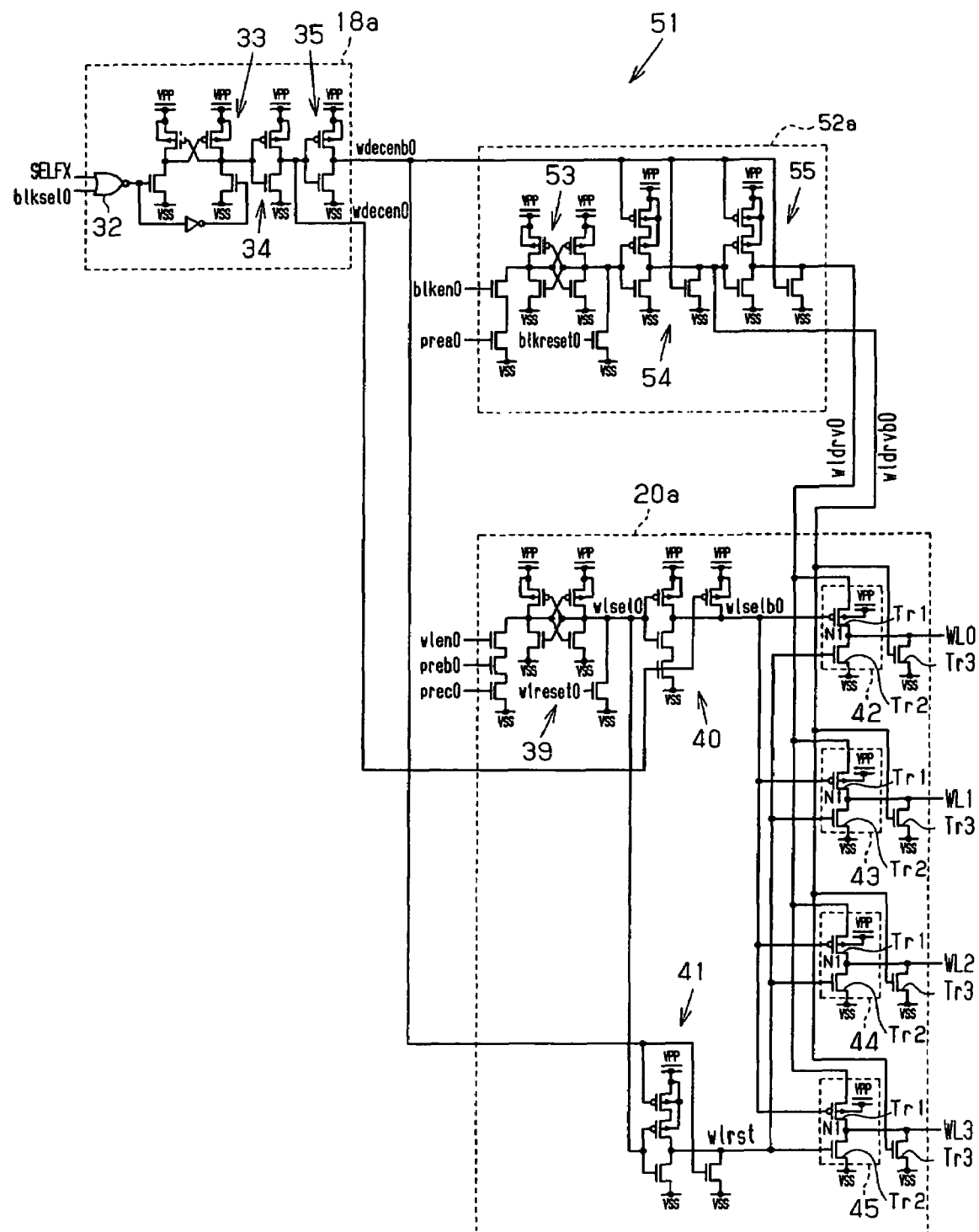
FIG. 5 is a circuit diagram of a semiconductor memory device according to a second embodiment of the present invention.

FIG. 5 is a circuit diagram describing the semiconductor memory device 51. The figure shows the part relating to control of the cell block BLK0. In the figure, the elements that are the same as the elements in the first embodiment are given the same reference numerals as those elements. The semiconductor memory device 51 has the same structure as the structure of the semiconductor memory device of the first embodiment except that the word line selector 19a in the first embodiment is partially changed.

Specifically, as shown in FIG. 5, a word line selector 52a in the present embodiment includes a latch circuit 53 and two NOR circuits 54 and 55. The word line selector 52a differs from the word line selector in the first embodiment in that the inverter circuit 38 is replaced by the NOR circuit 55. The operations of the latch circuit 53 and the NOR circuit 54 are the same as the operations of the latch circuit 36 and the NOR circuit 37 in the first embodiment shown in FIG. 4.

The word line selector 52a controls the drive signals wldrv0 and wldrvb0 to be at a L level (low potential power supply VSS) when the cell block BLK0 is not selected in the self-refresh mode. In this case, the sources of the transistors Tr1 included in the word line drive circuits 42 to 45 are supplied with the low potential power supply VSS at ground level.

Thus, the setting of the tailing currents A1 and A2 to satisfy the expression 1, which is required in the first embodiment, is not required in the second embodiment. When the cell block BLK0 is not selected in the self-refresh mode, the potential of each of the word lines WL0 to WL3 is reliably controlled to be a floating potential substantially at ground level.

The following describes the characteristics of the semiconductor memory device 51 according to the second embodiment of the present invention.

(1) The word lines WL are reliably controlled to have a floating potential substantially at ground level when the cell blocks BLK0 to BLK3 are not selected in the self-refresh mode, without requiring the tailing currents A1 and A2 to be set to satisfy the above expression 1. Thus, the second embodiment has better effects relating to the characteristics (1) to (4) of the first embodiment described above.

A semiconductor memory device 61 according to a third embodiment of the present invention is discussed with reference to FIGS. 6 and 7. The third embodiment relates to the semiconductor memory device 61 having a partial refresh function, and differs from the first embodiment in the method for setting a floating potential of a word line WL.

The partial refresh function is a function for refreshing only a specific cell block among the cell blocks BLK0 to BLK3. With the partial refresh, cell blocks that are not to be refreshed do not require their data to be guaranteed. With the partial refresh, consumption power is extremely lower.

Figure 6:
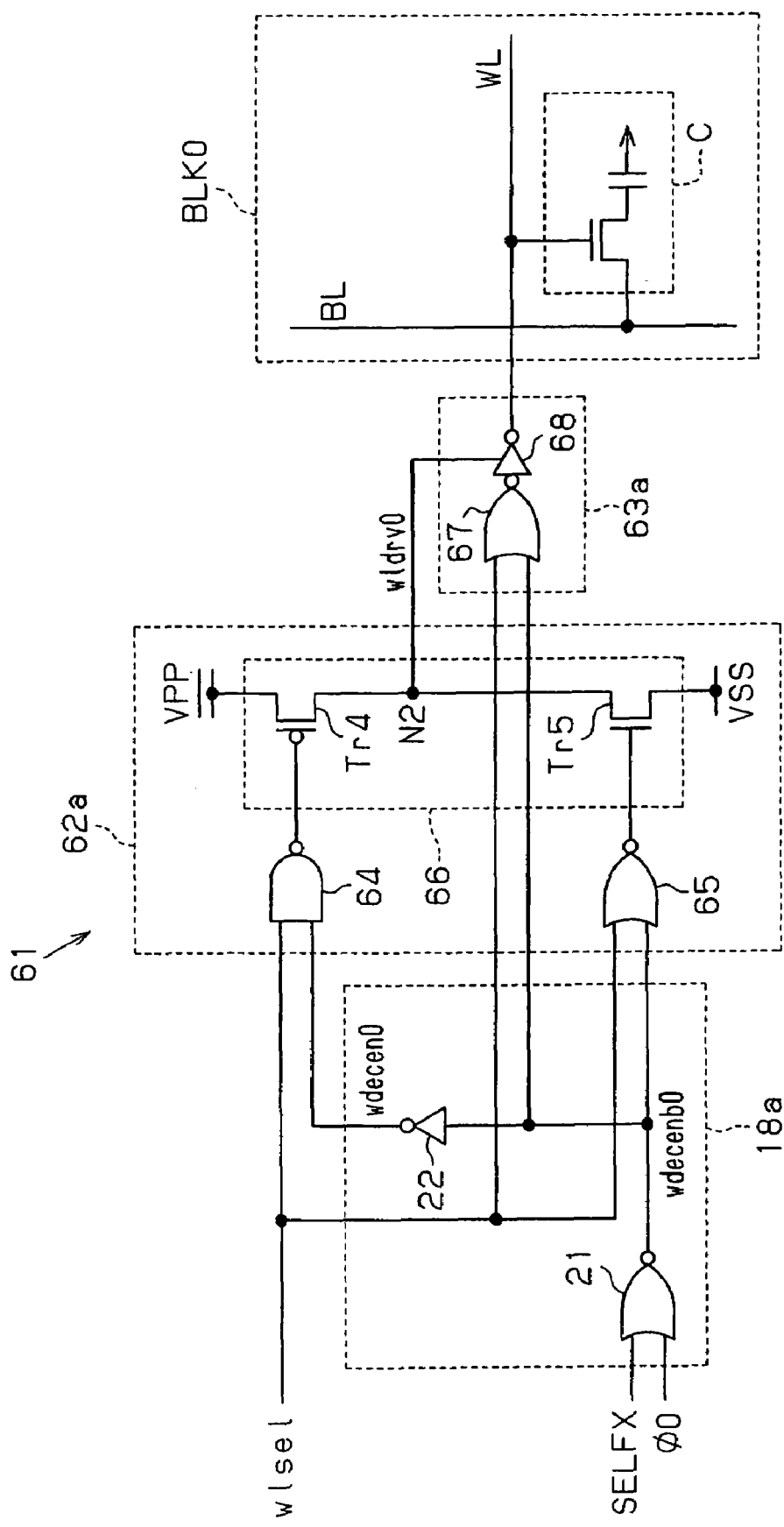
FIG. 6 is a schematic circuit diagram showing a semiconductor memory device according to a third embodiment of the present invention.

FIG. 6 is a schematic circuit diagram showing the part relating to control of the cell block BLK0 of the semiconductor memory device 61. In the figure, the elements that are the same as the elements in the first embodiment are given the same reference numerals as those elements. The semiconductor memory device 61 has the same structure as the structure of the semiconductor memory device of the first embodiment except that the structures of the word line selector 19a and the word decoder 20a in the first embodiment are partially changed.

Specifically, as shown in FIG. 6, a word line selector 62a in the third embodiment includes a NAND circuit 64, a NOR circuit 65, and a power supply control circuit 66. The power supply control circuit 66 is composed of a transistor Tr4 (third drive transistor) and a transistor Tr5 (fourth drive transistor).

In the present embodiment, the transistor Tr4 is formed by a p-channel MOS transistor, and the transistor Tr5 is formed by an n-channel MOS transistor.

A tailing current A4 of the transistor Tr4 and a tailing current A5 of the transistor Tr5 are set to satisfy the relationship expressed as tailing current A4<tailing current A5　　(expression 2).

The word decoder 63a includes a NOR circuit 67 and a word line drive circuit 68. The word line drive circuit 68 is connected to the word line WL. The word line drive circuit 68 has the same structure as the structure of the word line drive circuit 25 in the first embodiment.

The word line drive circuit 68 is provided with a drive signal wldrv0 output from the connecting node N2 between the transistor Tr4 and the transistor Tr5, which are included in the power supply control circuit 66.

The semiconductor memory device 61 with this structure controls the power supply control circuit 66 of the word line selector 62a to be in a deactivated state when the cell block BLK0 is not selected in the self-refresh mode.

Specifically, the transistors Tr4 and Tr5 are both turned off, so that the drive signal wldrv0 is controlled to have a floating potential, which is determined by a current ratio of the trailing currents A4 and A5 satisfying the relationship of the above expression 2 and by a threshold voltage of the transistor Tr4. In the present embodiment, the drive signal wldrv0 is controlled to have a floating potential substantially at ground level.

With this structure, the word line drive circuit 68 of the word decoder 63a receives the drive signal wldrv0 output from the power supply control circuit 66, and controls each word line WL of the cell block BLK0 to have a floating potential substantially at ground level.

Figure 7:
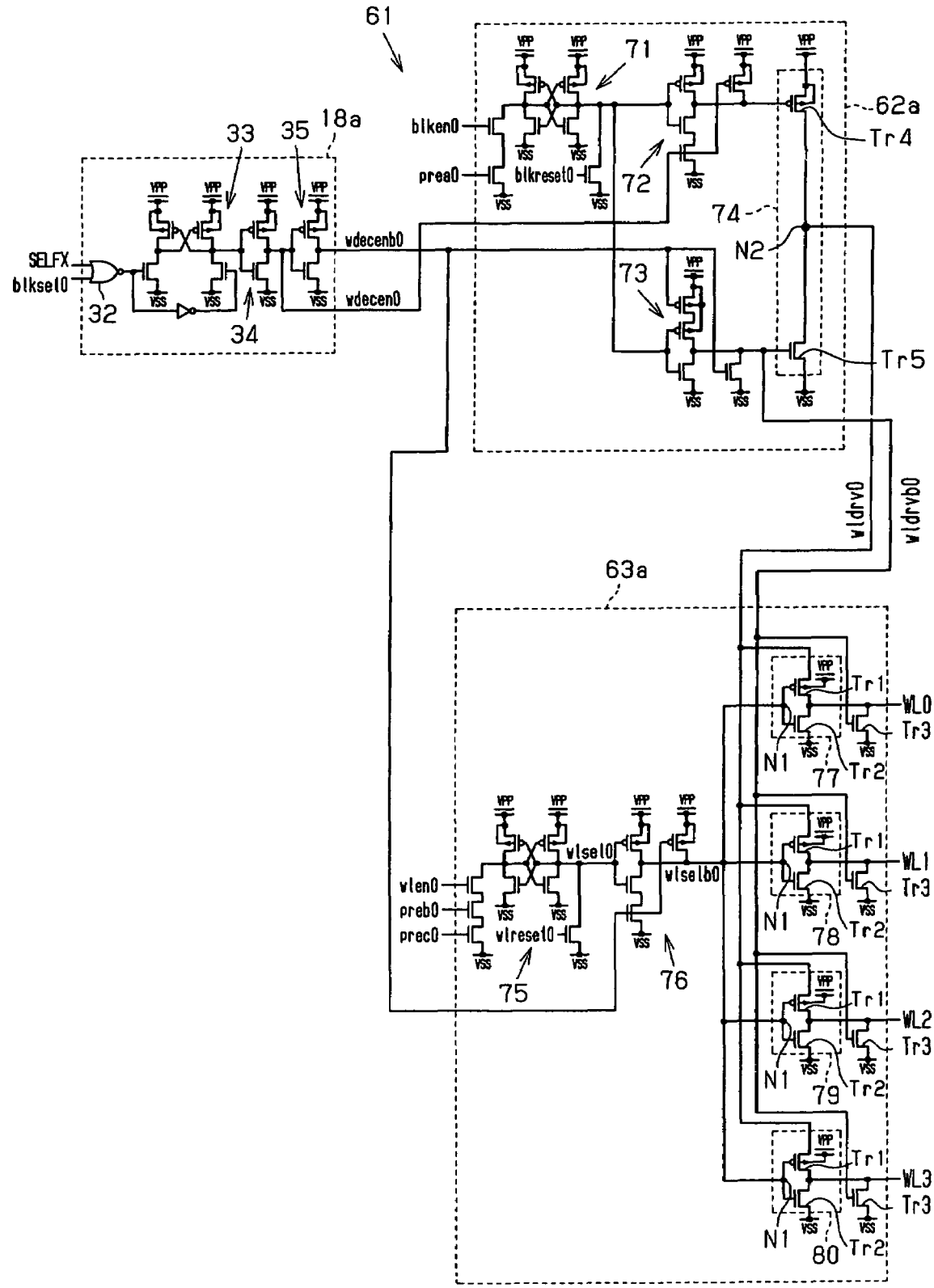
FIG. 7 is a circuit diagram of a word line control circuit, a word line selector, and a word decoder included in the semiconductor memory device according to the third embodiment of the present invention.

FIG. 7 is a circuit diagram showing specific examples of the word line control circuit 18a, the word line selector 62a, and the word decoder 63a. In the figure, the structure of the word line control circuit 18a is the same as the structure in the first embodiment shown in FIG. 4.

The word line selector 62a is more specifically shown in FIG. 7. The word line selector 62a includes a latch circuit 71, a NAND circuit 72, a NOR circuit 73, and a power supply control circuit 74. The power supply control circuit 74 is composed of the transistors Tr4 and Tr5 shown in FIG. 6.

The word line selector 62a turns off the transistors Tr4 and Tr5 when the cell block BLK0 is not selected in the self-refresh mode, and outputs, from the connecting node N2, a drive signal wldrv0 having a floating potential substantially at ground level. The operation of the word line selector 62a in the self-refresh mode or in the normal operation mode is the same as the operation in the first embodiment.

The word decoder 63a is more specifically shown in FIG. 7. The word decoder 63a has the structure corresponding to the case in which the cell block BLK0 includes, for example, four word lines WL0 to WL3.

The word decoder 63a includes a latch circuit 75, a NOR circuit 76, and four word line drive circuits 77 to 80.

As in the first embodiment described above, each of the word line drive circuits 77 to 80 is composed of transistors Tr1 and Tr2. At the connecting node N1 of the transistors Tr1 and Tr2, a transistor Tr3, which is formed by an n-channel MOS transistor, is connected in parallel to the transistor Tr2 (refer to FIG. 4).

A signal output from the NOR circuit 73 included in the above word line selector 62a is input as a drive signal wldrvb0 into the gate of the transistor Tr3. In the transistors Tr1 and Tr2 included in each of the word line drive circuits 77 to 80, the setting of the tailing currents A1 and A2 satisfying the above expression 1 is not required in the present embodiment.

The word decoder 63a turns on the transistor Tr1 of each of the word line drive circuits 77 to 80 when the cell block BLK0 is not selected in the self-refresh mode, and sets the potential of each of the word lines WL0 to WL3 to a floating potential substantially at ground level, which is supplied from the word line selector 62a. The operation of the word decoder 63a in the self-refresh mode or in the normal operation mode is the same as the operation in the first embodiment.

The semiconductor memory device 61 with this structure includes the word decoder 63a having a smaller number of wirings compared with the word decoder 20a in the first embodiment (refer to FIG. 4). The word decoder 63a is realized with an extremely simple structure.

However, this structure is effective only when the self-refresh is executed using the partial refresh function. This is because the partial refresh does not require data of cell blocks other than a refresh-target cell block to be guaranteed.

Specifically, when the cell block BLK2 is a partial refresh target among the cell blocks BLK0 to BLK3, the word lines of the cell blocks BLK0, BLK1, and BLK3, which are not refresh targets, are controlled to have a floating potential substantially at ground level. As in the first embodiment, a deficient current is reduced in the unselected cell blocks.

For example, when the word line WL0 of the cell block BLK0 is a deficient word line, the deficient potential of the deficient word line WL0 causes the potential of the drive signal wldrv0 output from the word line selector 62a to be substantially the deficient potential.

Then, the non-deficient word line WL1 adjacent to the deficient word line WL0 may also be set substantially at the deficient potential. This may cause a memory cell connected to the word line WL1 to be turned on, and information in the memory cell to be destroyed. This happens because all the word lines WL0 to WL3 are controlled to be in a floating state based on the same drive signal wldrv0 when the cell block BLK0 is in an unselected state. However, with the partial refresh described above, the cell blocks BLK0, BLK1, and BLK3, which are not refresh targets, do not require their data to be guaranteed. Thus, such information destruction causes no problem.

The following describes the characteristics of the semiconductor memory device 61 according to the third embodiment of the present invention.

(1) The semiconductor memory device 61 that executes partial refresh has the same effects as the effects relating to the characteristics (1) to (6) of the first embodiment described above. Further, the word decoder 63a is realized with an extremely simple structure having a smaller number of wirings compared with the word decoder 20a of the first embodiment.

The above embodiments may be modified in the following forms.

In the above embodiments, the case in which the memory cell array 12 is divided into the four cell blocks BLK0 to BLK3 is described as one example. However, the memory cell array 12 may be divided into a plurality of blocks other than four blocks.

In the above embodiments, the word lines WL are controlled to have a floating potential substantially at ground level when the cell blocks BLK0 to BLK3 are not selected in the refresh mode. However, the floating potential of each word line WL may be any other potential that does not cause the memory cell C to be turned on.

In the above embodiments, the low potential power supply VSS as the second power supply may be a negative power supply.

The structures according to the first and second embodiments may be applied to a semiconductor memory device that executes partial refresh.

The transistors Tr1 and Tr2 (first and second drive transistors) included in each of the word line drive circuits 25, 42 to 45, 68, and 77 to 80 may be formed by transistors with other polarities (e.g., both may be formed by n-channel MOS transistors). In this case, the structures of the word decoders 20a and 63a are to be changed to have logic according to those transistors.

In the above embodiments, the method for controlling self-refresh executed during standby is described. However, the present invention should not be limited to self-refresh.

The present examples and embodiments are to be considered as illustrative and not restrictive, and the invention is not to be limited to the details given herein, but may be modified within the scope and equivalence of the appended claims.

What is claimed is:

1. A method for selectively refreshing a plurality of memory cell blocks of a semiconductor memory device in refresh mode, wherein the semiconductor memory device includes a plurality of word line drive circuits each for driving a word line of the corresponding memory cell block, the method comprising:

selecting one of the plurality of memory cell blocks in the refresh mode; and deactivating one or more word line drive circuits associated with one or more memory cell blocks that have not been selected, and controlling one or more word lines, which are associated with the one or more memory cell blocks that have not been selected, to have a floating potential.

2. The method according to claim 1, wherein the floating potential has a level substantially corresponding to ground.

3. The method according to claim 1, wherein the floating potential is a negative potential.

4. The method according to claim 1, wherein each of the plurality of word line drive circuits includes a first drive transistor for driving the corresponding word line based on a first power supply, and a second drive transistor, connected in series to the first drive transistor, for driving the corresponding word line based on a second power supply having a lower potential than that of the first power supply, with each drive transistor having a tailing current and the floating potential is determined by a tailing current ratio of the first and second drive transistors.

5. The method according to claim 4, wherein the tailing current ratio is set so that the tailing current of the first drive transistor is larger than the tailing current of the second drive transistor.

6. The method according to claim 1, wherein each of the plurality of word line drive circuits includes a first drive transistor for driving the corresponding word line based on a first power supply, and a second drive transistor, connected in series to the first drive transistor, for driving the corresponding word line based on a second power supply having a lower potential than the first power supply, the method further comprising:

supplying the first drive transistor with the second power supply when the corresponding word line drive circuit is deactivated.

* * * * *